(12) United States Patent
Erickson et al.

(10) Patent No.: US 7,684,160 B1
(45) Date of Patent: *Mar. 23, 2010

(54) MAGNETORESISTIVE STRUCTURE HAVING A NOVEL SPECULAR AND BARRIER LAYER COMBINATION

(75) Inventors: Dustin Erickson, San Jose, CA (US);
Chang-man Park, Mountain View, CA (US); Shin Funada, Pleasanton, CA (US); Lena Miloslavsky, Sunnyvale, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 1082 days.

This patent is subject to a terminal disclaimer.

(21) Appl. No.: 11/348,190

(22) Filed: Feb. 6, 2006

(51) Int. Cl.
*G11B 5/39* (2006.01)

(52) U.S. Cl. .................................. 360/324.1

(58) Field of Classification Search .............. 360/324.1, 360/324.11, 324.12
See application file for complete search history.

(56) References Cited

U.S. PATENT DOCUMENTS

| | | | |
|---|---|---|---|
| 5,874,010 A | 2/1999 | Tao et al. | |
| 5,898,612 A | 4/1999 | Chen et al. | |
| 6,407,890 B1 | 6/2002 | Gill | |
| 6,519,121 B1 | 2/2003 | Gill | |
| 6,556,390 B1 | 4/2003 | Mao et al. | |
| 6,591,481 B2 | 7/2003 | Shimazawa et al. | |
| 6,613,380 B1 | 9/2003 | Gill | |
| 6,636,398 B2 | 10/2003 | Sasaki et al. | |
| 6,693,776 B2 | 2/2004 | Gill | |
| 6,700,753 B2 | 3/2004 | Singleton et al. | |
| 6,735,060 B2 | 5/2004 | Gill | |
| 6,754,053 B2 | 6/2004 | Yoshikawa et al. | |
| 6,764,778 B2 | 7/2004 | Saito et al. | |
| 6,770,382 B1 | 8/2004 | Chang et al. | |
| 6,775,111 B2 | 8/2004 | Lin et al. | |
| 6,795,279 B2 | 9/2004 | Singleton et al. | |
| 6,853,520 B2 | 2/2005 | Fukuzawa et al. | |
| 7,006,337 B2 | 2/2006 | Dieny et al. | |
| 7,026,063 B2 | 4/2006 | Ueno et al. | |
| 7,038,890 B2 | 5/2006 | Pinarbasi | |
| 7,050,273 B2 | 5/2006 | Horng et al. | |
| 7,130,163 B2 | 10/2006 | Fukuzawa et al. | |

(Continued)

OTHER PUBLICATIONS

Office Action dated Dec. 17, 2007 from U.S. Appl. No. 11/114,295, 18 pages.

(Continued)

*Primary Examiner*—Craig A. Renner
(74) *Attorney, Agent, or Firm*—Virtual Law Partners

(57) ABSTRACT

A method and system for providing a magnetoresistive structure is disclosed. The magnetoresistive structure includes a pinned layer, a nonmagnetic spacer layer, a free layer, a specular layer, a barrier layer, and a capping layer. The spacer layer resides between the pinned layer and the free layer. The free layer is electrically conductive and resides between the specular layer and the nonmagnetic spacer layer. The specular layer is adjacent to the free layer and includes at least one of titanium oxide, yttrium oxide, hafnium oxide, magnesium oxide, aluminum oxide, nickel oxide, iron oxide, zirconium oxide, niobium oxide, and tantalum oxide. The barrier layer resides between the specular layer and the capping layer. The barrier layer is nonmagnetic and includes a first material. The capping layer includes a second material different from the first material.

18 Claims, 7 Drawing Sheets

U.S. PATENT DOCUMENTS

| | | |
|---|---|---|
| 7,417,832 B1 | 8/2008 | Erickson et al. |
| 2002/0004147 A1 | 1/2002 | Ueno et al. |
| 2002/0024778 A1 | 2/2002 | Xue et al. |
| 2002/0048127 A1 | 4/2002 | Fukuzawa et al. |
| 2002/0163765 A1 | 11/2002 | Gill |
| 2002/0191354 A1 | 12/2002 | Yoshikawa et al. |
| 2002/0196589 A1 | 12/2002 | Gill |
| 2003/0026049 A1 | 2/2003 | Gill |
| 2004/0130833 A1 | 7/2004 | Zhang et al. |
| 2004/0136121 A1 | 7/2004 | Mao et al. |
| 2004/0170867 A1 | 9/2004 | Chang et al. |
| 2005/0024771 A1 | 2/2005 | Le |
| 2005/0047028 A1 | 3/2005 | Fukuzawa et al. |
| 2005/0066517 A1 | 3/2005 | Bedell et al. |
| 2005/0068665 A1 | 3/2005 | Le et al. |
| 2005/0094322 A1 | 5/2005 | Fukuzawa et al. |
| 2005/0099738 A1 | 5/2005 | Xue et al. |
| 2005/0111145 A1 | 5/2005 | Yuasa et al. |
| 2005/0231853 A1 | 10/2005 | Li et al. |
| 2005/0231854 A1 | 10/2005 | Kawai |
| 2006/0028773 A1 | 2/2006 | Shimazawa et al. |
| 2006/0162148 A1 | 7/2006 | Horng et al. |
| 2006/0181815 A1 | 8/2006 | Horng et al. |

OTHER PUBLICATIONS

Jongill Hong, et al., "Design of specularly reflective layers in spin valves", Journal of Applied Physics, vol. 94, No. 5, Sep. 2003, pp. 3288-3291.

Jongill Hong, et al., "Spin Valve Head With Specularly Reflective Oxide Layers for Over 100 Gb/in2", IEEE Transactions on Magnetics, vol. 38, No. 1, Jan. 2002, pp. 15-19.

Tetsuya Mizuguchi, et al., "Characteristics of Spin-Valve Films with Non-Magnetic Oxide Layers for Specular-Scattering", IEEE Transactions on Magnetics, vol. 37, No. 4, Jul. 2001, pp. 1742-1744.

Hitoshi Kanai, et al., "Advanced Spin-Valve GMR Head", Fujitsu Sci. Tech. J., 37, Dec. 2, 2001, pp. 174-182.

Office Action dated Feb. 21, 2008 from U.S. Appl. No. 11/114,255, 10 pages.

Notice of Allowance dated May 7, 2008 from U.S. Appl. No. 11/114,255, 6 pages.

Office Action dated Jul. 11, 2007, from U.S. Appl. No. 11/114,295, 11 pages.

Office Action dated Jul. 6, 2007 from U.S. Appl. No. 11/114,255, 10 pages.

Office Action dated Sep. 20, 2007 from U.S. Appl. No. 11/114,255, 16 pages.

MAGNETORESISTIVE STRUCTURE HAVING A NOVEL SPECULAR AND BARRIER LAYER COMBINATION

CROSS-REFERENCE TO RELATED APPLICATIONS

The present application is related to co-pending U.S. application Ser. No. 11/114,295, entitled "Magnetoresistive Structure Having a Novel Specular Layer" filed on Apr. 26, 2005 and assigned to the assignee of the present application. The present application is related to co-pending U.S. application Ser. No. 11/114,255 entitled "Magnetoresistive Structure Having a Novel Specular and Filter Layer Combination" filed on Apr. 26, 2005 and assigned to the assignee of the present application.

FIELD OF THE INVENTION

The present invention relates to magnetic recording technology, and more particularly to a method and system for providing an improved magnetic structure, such as a spin valve or spin filter.

BACKGROUND OF THE INVENTION

In the effort toward achieving higher data density on recording media, spin filters have become of interest for use in magnetoresistive (MR) read heads. FIG. 1 is a diagram of a conventional spin filter 10. In general, the conventional spin filter 10 would be incorporated into a MR read head (not explicitly shown), which would include leads electrically connected to other electronics to drive current through the conventional spin filter 10 during reading. In such an application, current is generally driven in the current perpendicular to the plane (CPP) configuration. The CPP configuration is in the z-direction depicted in FIG. 1.

The conventional spin filter 10 includes a seed layer 12, an antiferromagnetic (AFM) layer 14, a pinned layer 16, a nonmagnetic spacer layer 24, a free layer 26, a filter layer 28, a specular oxide layer 30, and a capping layer 32. The seed layer 12 is used to provide the appropriate surface for growing the AFM layer 14 with the desired crystal structure. The AFM layer 14 is used in pinning the magnetization of the pinned layer 16. The pinned layer 16 may be a synthetic pinned layer, including ferromagnetic layers 18 and 22 separated by an electrically conductive spacer layer 20 that is typically Ru. The electrically conductive spacer layer 20 has a thickness configured to ensure that the ferromagnetic layers 18 and 22 are antiferromagnetically coupled. Thus, the magnetization of the ferromagnetic layer 18 is pinned by the AFM layer 14. The magnetization of the ferromagnetic layer 22 is set because it is strongly antiferromagnetically coupled to the magnetization of the ferromagnetic layer 18. The nonmagnetic spacer layer 24 is typically electrically conductive, for example Cu. The free layer 26 is ferromagnetic and typically includes materials such as CoFe.

The filter layer 28 has a high electrical conductivity and typically includes materials such as Cu. The specular oxide layer 30 may be a nano-oxide and typically includes materials such as alumina. The combination of the filter layer 28 and the specular oxide layer 30 has been used to provide adequate specularity of scattering of electrons from the free layer 26 that are incident on the specular oxide layer 30. In particular, the filter layer 28 has been utilized in the conventional spin filter 10 to provide a region, or filter, for specular reflection between the free layer 26 and specular layer 30. Thus, the magnetoresistance of the conventional spin filter 10 is improved. Consequently, the magnetoresistance of the conventional spin filter 10 is adequate. The capping layer 32 is typically oxidized Ta.

Although the conventional spin filter 10 functions, there are drawbacks to the use of the conventional spin filter 10. Insertion of the specular oxide layer 30 can increase the coercivity of the free layer 26, which is undesirable. Furthermore, the specular oxide layer 30 is generally a nano-oxide that can continue to oxidize during processing. The signal may degrade during the lifetime of the conventional spin filter 10. The conventional spin filter 10 thus suffers thermal instabilities and may have reduced reliability.

Analogous conventional spin filters are described in U.S. Pat. No. 6,795,279 B2; U.S. Pat. No. 6,556,390 B1; U.S. Pat. No. 5,898,612; U.S. Pat. No. 6,407,890 B1; U.S. Pat. No. 6,764,778 B2; U.S. Pat. No. 6,700,753 B2; U.S. Pat. No. 6,775,111 B2; U.S. Pat. No. 6,591,481; U.S. Pat. No. 6,613,380 B1; U.S. Pat. No. 6,636,398 B2.

Accordingly, what is needed is a system and method for providing a spin filter having improved thermal stability, signal sensitivity, and/or reliability.

SUMMARY

The present invention provides a method and system for providing a magnetic structure. The magnetoresistive structure comprises a pinned layer, a nonmagnetic spacer layer, a free layer, a specular layer, a barrier layer, and a capping layer. The spacer layer resides between the pinned layer and the free layer. The free layer is electrically conductive and resides between the specular layer and the nonmagnetic spacer layer. The specular layer is adjacent to the free layer and includes at least one of titanium oxide, yttrium oxide, hafnium oxide, magnesium oxide, aluminum oxide, nickel oxide, iron oxide, zirconium oxide, niobium oxide, and tantalum oxide. The barrier layer resides between the specular layer and the capping layer. The barrier layer is nonmagnetic and includes a first material. The capping layer includes a second material different from the first material.

DETAILED DESCRIPTION OF THE PREFERRED EMBODIMENTS

The present application is related to co-pending U.S. application Ser. No. 11/114,295 entitled "Magnetoresistive Structure Having a Novel Specular Layer" (Co-pending application 1) filed on Apr. 26, 2005 and assigned to the assignee of the present application. The present application is related to co-pending U.S. Application Ser. No. 11/114,255 entitled "Magnetoresistive Structure Having a Novel Specular and Filter Layer Combination" (Co-pending application 2) filed on Apr. 26, 2005 and assigned to the assignee of the present application. Applicant hereby incorporates by reference the above-identified co-pending applications 1 and 2.

Figure 1:
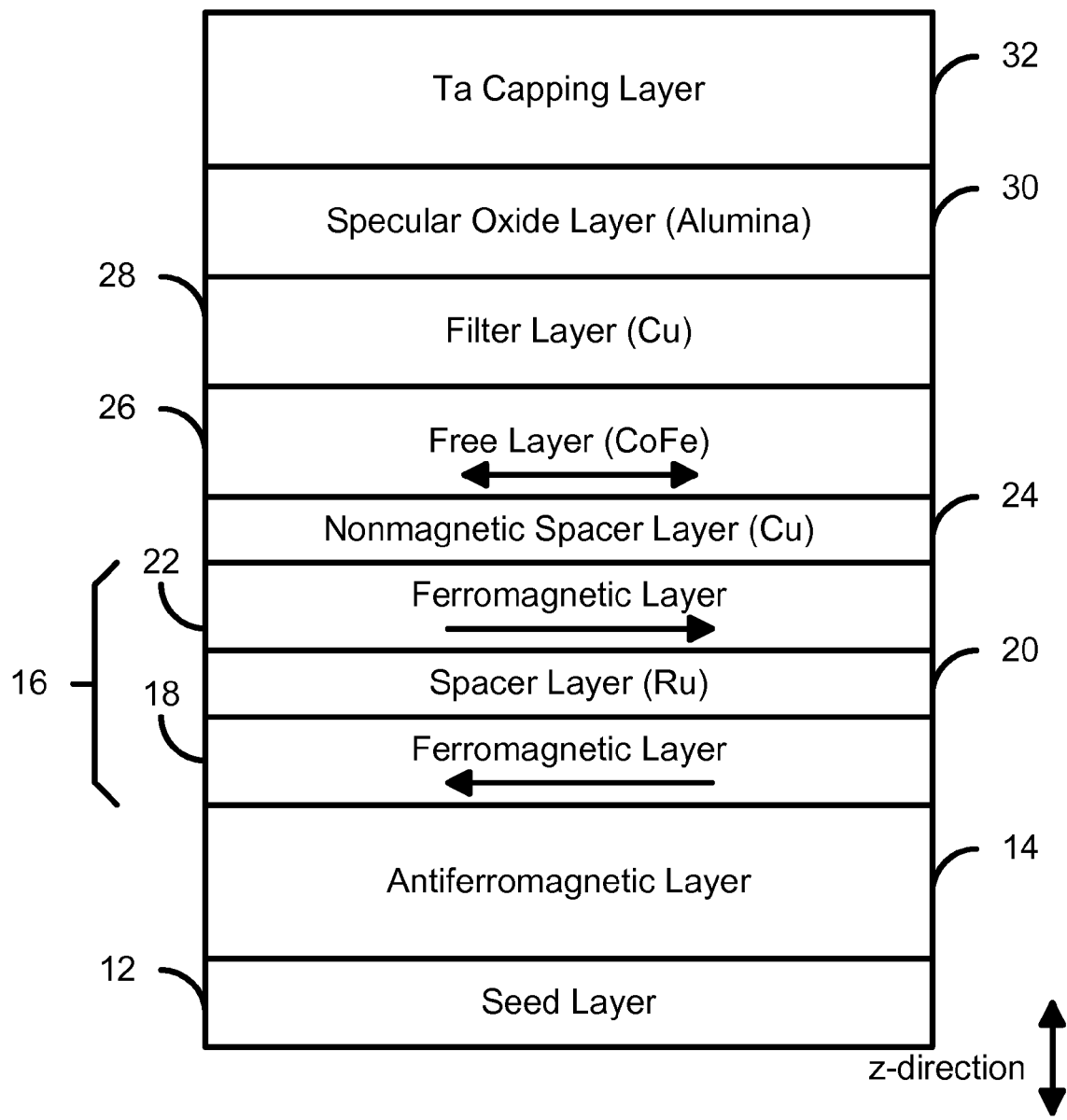
FIG. 1 is a diagram of a conventional spin filter.
Figure 2A:
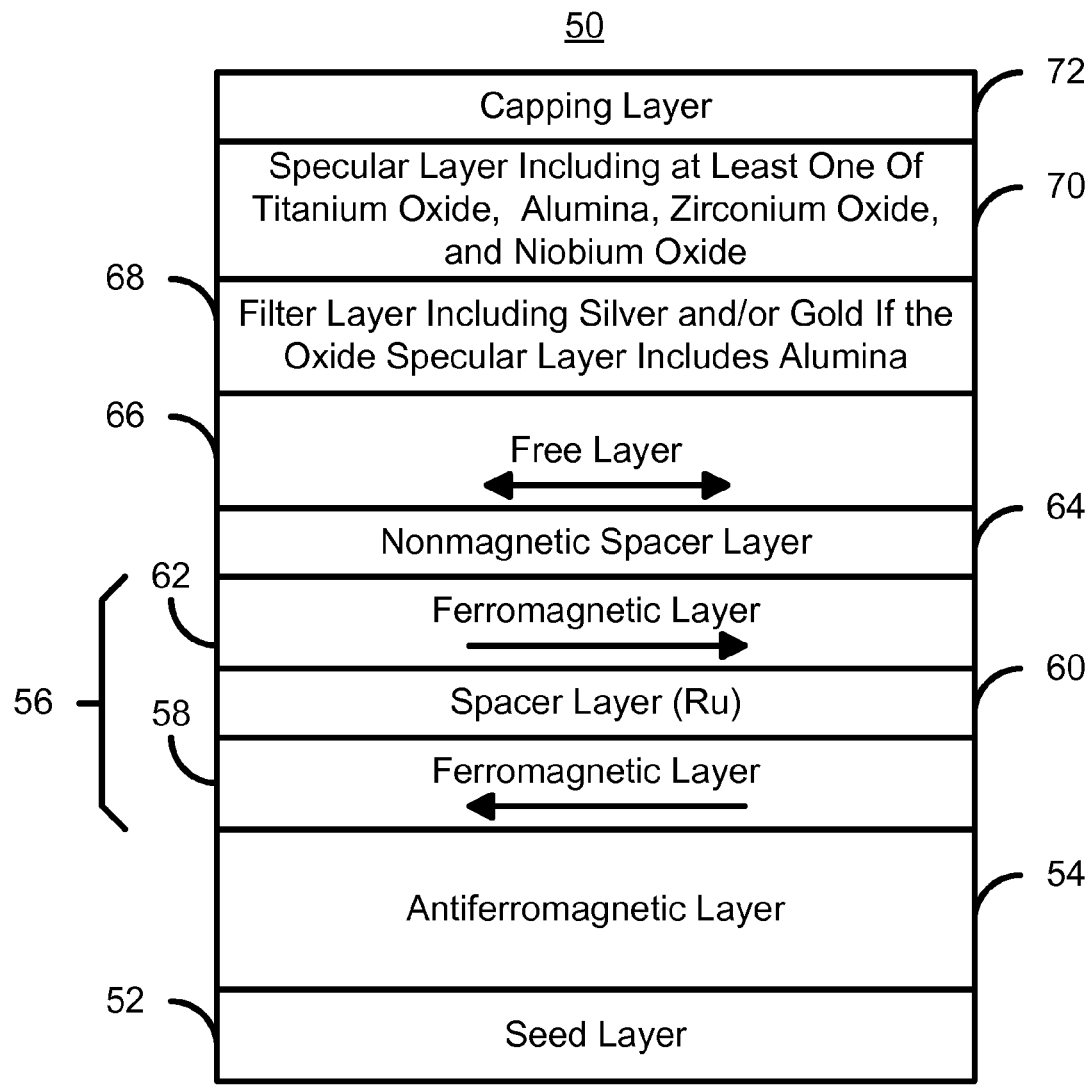
FIGS. 2A-2B are diagrams of spin filters formed in accordance with exemplary embodiments described in the co-pending patent applications.
Figure 2B:
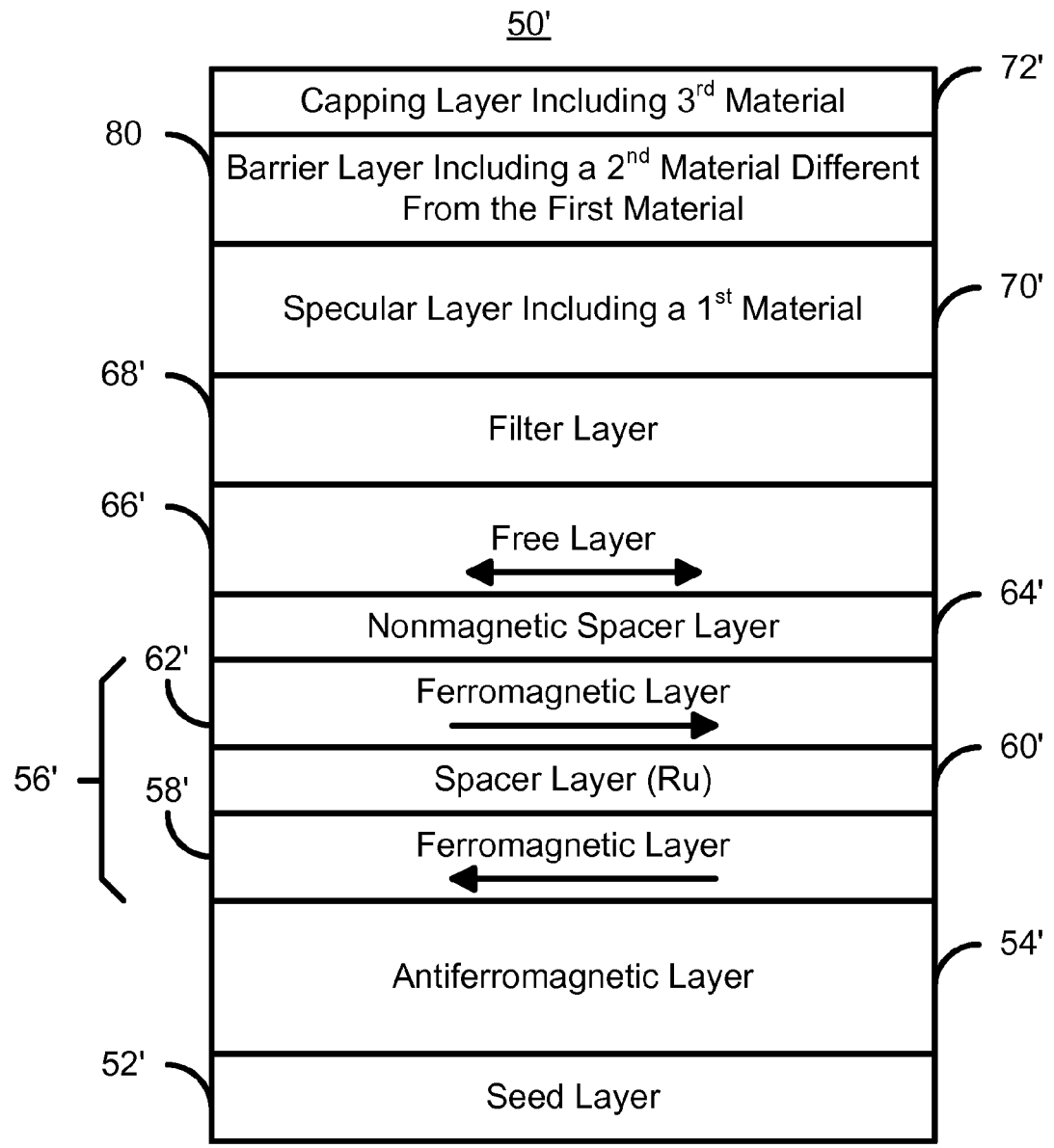

FIGS. 2A and 2B depict embodiments of spin filters 50 and 50' formed using the teachings of the above-identified co-pending patent applications. The spin filter 50 includes a seed layer 52, a pinning layer 54 that is typically an AFM layer, a pinned layer 56, a spacer layer 64, a free layer 66, a filter layer 68, a specular oxide layer 70, and a capping layer 72. The pinned layer 56 may be a synthetic pinned layer including ferromagnetic layers 58 and 62 separated by a conductive, nonmagnetic spacer layer 60. The spacer layer 64 is nonmagnetic and may be conductive. The free layer 66 is electrically conductive and resides between the filter layer 68 and the nonmagnetic spacer layer 64. The specular layer 70 includes at least one of titanium oxide, alumina, zirconium oxide, and niobium oxide. The filter layer 68 includes at least one of gold and silver if the specular layer 70 includes alumina. The spin filter 50' includes layers 52', 54', 56', 58', 60', 62', 64', 66', 68', 70', and 72'. However, the spin filter 50' also includes a barrier layer 80. In addition, the specular layer 70' may include a first material and is electrically insulating. The barrier layer 80 resides between the specular layer 70' and the capping layer 72'. The barrier layer 80 is nonmagnetic and includes a second material different material from the first material. The capping layer 72' includes a third material different from the second material.

The spin filters 50 and 50' may have the desired signal without the adversely affecting the electrical resistance. Consequently, the performance of the spin filters 50 and 50' may be improved. Moreover, it is noted that the spin filter 50/50' may be used in either a CPP or CIP (current in plane) configuration. Although the spin filters 50 and 50' function, they may suffer from damage during processing. Consequently, a magnetic structure having improved performance and reliability is desired.

Figure 3:
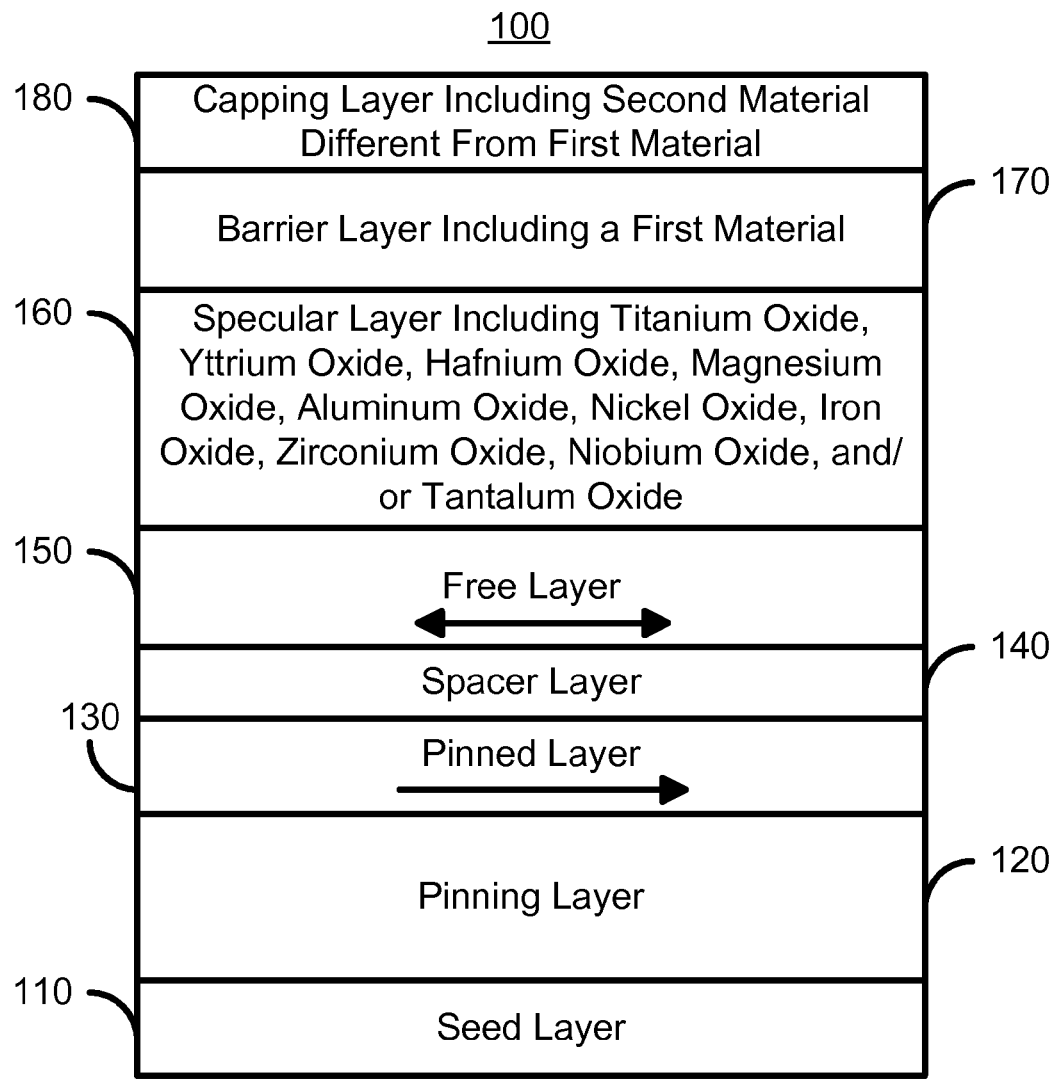
FIG. 3 is a diagram of a spin filter formed in accordance with an exemplary embodiment of the present invention.

FIG. 3 depicts a magnetic structure 100 formed in accordance with an exemplary embodiment of the present invention. For clarity, the magnetic structure 100 is not depicted to scale. The magnetic structure 100 includes a pinning layer 120, pinned layer 130, nonmagnetic spacer layer 140, a free layer 150, a specular layer 160, a barrier layer 170 and a capping layer 180. The magnetic structure 100 may also include seed layer(s) 110 used to ensure that the pinning layer 120 has the desired crystal structure and, therefore, magnetic properties. For example, the seed layer(s) 110 might include Ta, Ta/NiFe, NiCr, NiFeCr, Ru, NiFe, CoFe or any combination thereof.

The pinning layer 120 is generally an AFM layer. The AFM materials used in the pinning layer 120 is preferably IrMn, but can include other AFM materials. For example, the AFM materials used may include, but are not limited to PtMn, NiMn, PtCrMn, and IrMn. The pinned layer 130 is depicted as a simple layer, but is preferably a synthetic pinned layer, as described in connection with FIG. 4, below. In the embodiment shown, the magnetization of the ferromagnetic layer 130 is pinned by the pinning layer 120.

The nonmagnetic spacer layer 140 is preferably an electrical conductor, such as Cu. The nonmagnetic spacer layer 140 thus may include Cu, Ta, Pt, Au, or Ag, alloy(s) thereof, and/or other low electrical resistance material(s). In another embodiment, the nonmagnetic spacer layer 140 may be an insulator. In such an embodiment, the nonmagnetic spacer layer 140 is preferably sufficiently thin to act as a tunneling barrier. The free layer 150 as well as the pinned layer 130 may include materials such as $Co_{1-x}Fe_x$ alloy, where x can vary from one to ninety-nine atomic percent and/or NiFe. However, other suitable materials may be used. In addition, although a simple free layer is depicted, a synthetic free layer may be used for the free layer 150.

The magnetic structure 100 also includes the specular layer 160, barrier layer 170, and capping layer 180 in accordance with the present invention. The specular layer 160 is configured such that current carriers from the free layer 150 tend to undergo specular reflection by the specular oxide layer. The specular layer 160 is preferably a nano-oxide layer and is, therefore, insulating. The specular layer 160 may thus be formed by a plasma oxidation of the metallic materials. However, other processes such as natural and radical oxidation may be used. The specular layer 160 includes at least one of titanium oxide, yttrium oxide, hafnium oxide, magnesium oxide, aluminum oxide, nickel oxide, iron oxide, zirconium oxide, niobium oxide, and tantalum oxide. In a preferred embodiment, the specular layer consists essentially of titanium oxide. The specular layer 160 has a thickness of between five and thirty Angstroms, and more preferably a thickness of between eight and fifteen Angstroms.

The barrier layer 170 is configured to reduce or prevent intermixing between the capping layer 180 and the specular layer 160. In addition, if the barrier layer 170 includes a first material, then the capping layer 180 includes a second material different from the first material. In one embodiment, the barrier layer 170 includes at least one of Cu, Pt, Au, and Ag. In a preferred embodiment, the barrier layer 170 consists essentially of Cu. The barrier layer 170 may have a thickness of at least five and not more than forty Angstroms. In a preferred embodiment, the thickness of the barrier layer is at least twenty-five and not more than thirty-five Angstroms.

The capping layer 180 is a capping layer formed of a different material than the barrier layer 170. In one embodiment, the capping layer 180 includes material(s) such as a Ta layer or a Ti layer that have been formed into a natural oxide.

The properties of the specular layer 160, the barrier layer 170, and the free layer 150 are related. In particular, the magnetic structure 100 is analogous to a spin filter. Thus, the magnetic structure 100 exhibits giant magnetoresistance. However, as can be seen in FIG. 3, a filter layer has been omitted. Specular reflection in and around the specular layer 160 may be moved closer to the free layer 170 and incomplete specular scattering may be reduced by the omission of a filter layer. Thus, the magnetic structure 100 may have improved giant magnetoresistance. In addition, the barrier layer 170 is configured to prevent the specular layer 160 from intermixing with other layers, such as the capping layer 180. Moreover, the barrier layer has a preferred thickness, between twenty-five and thirty-five Angstroms. In particular, the interface between the barrier layer 170 and the specular layer 160 for a barrier layer 170 in the preferred thickness range may improve the magnetic properties, such as giant magnetoresistance, of the magnetic structure 100. Furthermore, the preferred thickness of the barrier layer 170, the reliability of the magnetic structure 100 may also be improved. In addition, damage during processing for the magnetic structure 100 having the combination of the free layer 150, specular layer 160, and barrier layer 170 described above may also be reduced.

Thus, the magnetic structure 100 may have the desired signal. In some embodiments, the magnetic structure may have a giant magnetoresistance higher than that of the conventional spin filter 10, the spin filters 50 and 50', and conventional spin valves (not shown). This may be achieved without the adversely affecting the reliability. Consequently, both the performance and the reliability of the magnetic structure 100 may be improved. Moreover, it is noted that the magnetic structure 100 may be used in either a CPP or CIP (current in plane) configuration.

Figure 4:
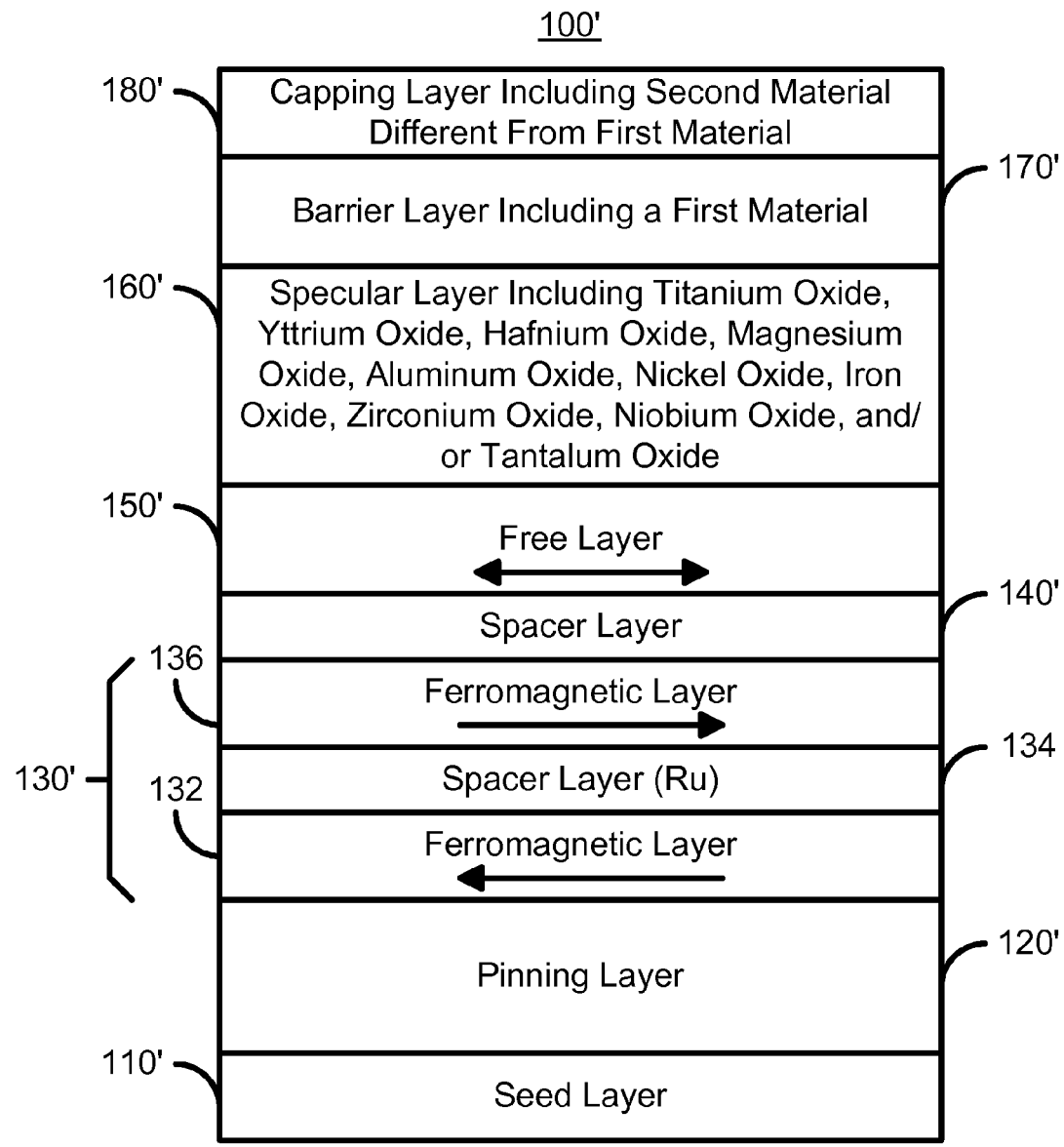
FIG. 4 is a diagram of a spin filter formed in accordance with another exemplary embodiment of the present invention.

FIG. 4 depicts a magnetic structure 100' formed in accordance with another exemplary embodiment of the present invention. For clarity, the magnetic structure 100' is not depicted to scale. The magnetic structure 100' is analogous to the magnetic structure 100. The magnetic structure 100' includes a pinning layer 120', pinned layer 130', nonmagnetic spacer layer 140', a free layer 150', a specular layer 160', a barrier layer 170', a capping layer 180', and may include seed layer(s) 110' that are analogous to the layers 120, 130, 140, 150, 160, 170, and 180, respectively. For example, the specular layer 160' is configured such that current carriers from the free layer 150' tend to undergo specular reflection by the specular oxide layer 160'. Thus, the specular layer 160' includes at least one of titanium oxide, yttrium oxide, hafnium oxide, magnesium oxide, aluminum oxide, nickel oxide, iron oxide, zirconium oxide, niobium oxide, and tantalum oxide. The specular layer 160' preferably includes titanium oxide. Similarly, the barrier layer 180' is configured to prevent the specular layer 170' from intermixing with the capping layer 170' and includes material(s) that are not the same as the capping layer 180'. The barrier layer 170' thus preferably includes Cu, and may also include Pt, Au, and/or Ag. In addition, the thickness ranges of the specular layer 160' and the barrier layer 170' are preferably the same as for the specular layer 160 and the barrier layer 170, respectively.

However, the pinned layer 130' is a synthetic pinned layer including ferromagnetic layers 132 and 136 separated by a spacer layer 134. The spacer layer 134 is preferably Ru. The thickness of the spacer layer is selected such that the ferromagnetic layers 132 and 136 are antiferromagnetically coupled.

The magnetic structure 100' shares the benefits of the magnetic structure 100. Thus, the magnetic structure 100' may have improved magnetoresistance. This may be achieved without the adversely affecting the reliability. Consequently, both the performance and the reliability of the magnetic structure 100' may be improved. In addition, the magnetic structure 100' may be used in either a CPP or CIP configuration.

Figure 5:
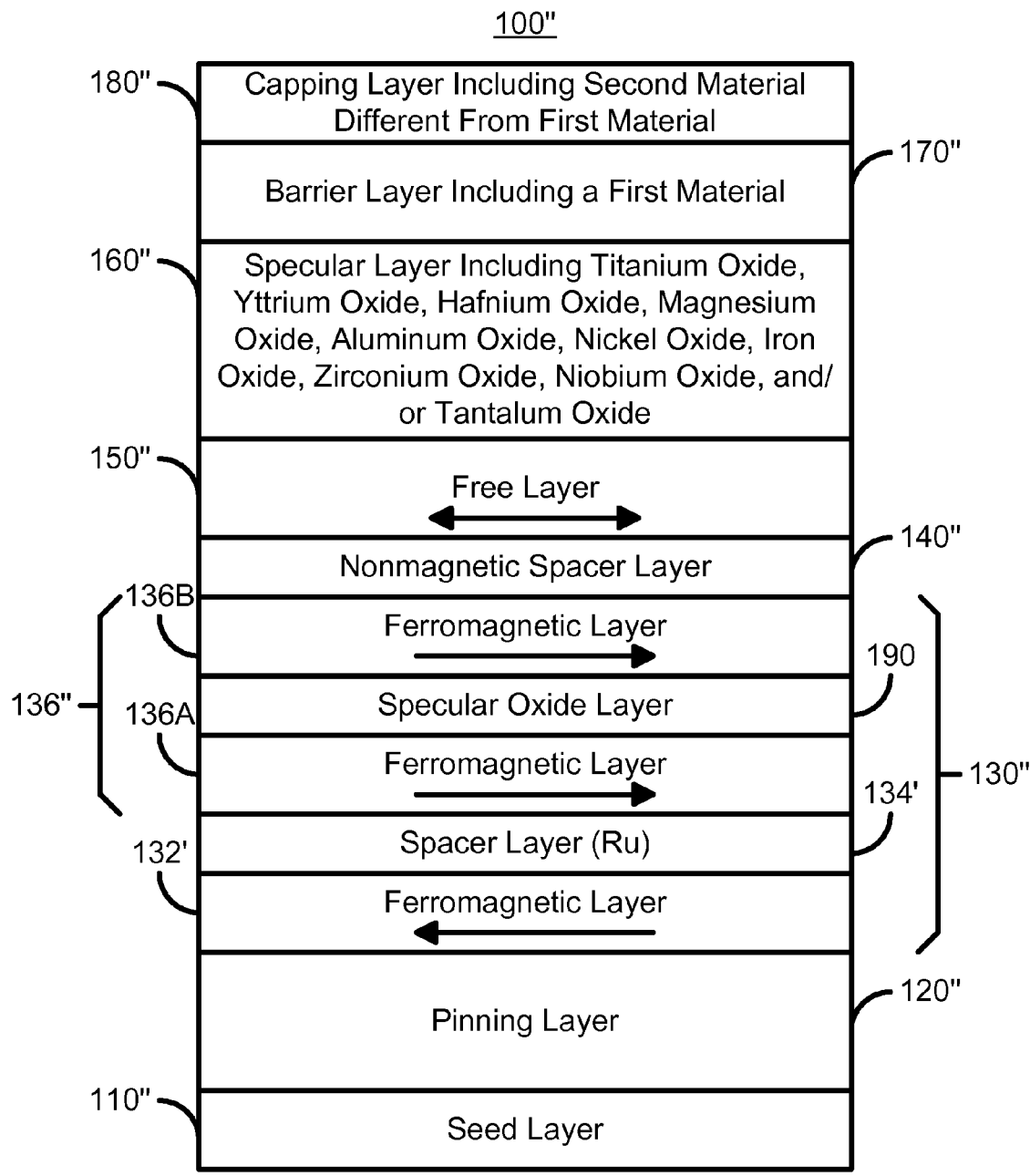
FIG. 5 is a diagram of a spin filter formed in accordance with another exemplary embodiment of the present invention.

FIG. 5 is a diagram of a magnetic structure 100" formed in accordance with another exemplary embodiment of the present invention. For clarity, the magnetic structure 100" is not depicted to scale. The magnetic structure 100' includes components analogous to the components of the magnetic structure 100'. Consequently, the magnetic structure 100" includes a pinning layer 120", pinned layer 130", nonmagnetic spacer layer 140", a free layer 150", a specular layer 160", a barrier layer 170", and a capping layer 180". The magnetic structure 100 may also include seed layer(s) 110".

The layers 110", 120", 130", 132', 134', 140", 150", 160", 170", and 180" preferably have the same structure and function as the layers 110', 120', 130', 132, 134, 140', 150', 160', 170', and 180', respectively. For example, the specular layer 160" includes at least one of titanium oxide, yttrium oxide, hafnium oxide, magnesium oxide, aluminum oxide, nickel oxide, iron oxide, zirconium oxide, niobium oxide, and tantalum oxide. The specular layer 160" preferably includes titanium oxide. Thus, the specular layer 160" is configured such that current carriers from the free layer 150" tend to undergo specular reflection by the specular oxide layer. Similarly, the barrier layer 170" is configured to prevent the specular layer 160" from intermixing with the capping layer 180". The barrier layer 170" includes material(s) that are not the same as the capping layer 180". The barrier layer 170" thus preferably includes Cu, and may also include Pt, Au, and/or Ag. In addition, the thickness ranges of the specular layer 160" and the barrier layer 170" are preferably the same as for the specular layer 160 and the barrier layer 170, respectively.

The magnetic structure 100" also includes an additional specular oxide layer 190, which resides within the ferromagnetic layer 136". The specular oxide layer 190 is preferably a nano-oxide layer. Thus, the ferromagnetic layer 136" includes ferromagnetic layers 136A and 136B. The specular oxide layer 190 is configured such that current carriers from the free layer 150" tend to undergo specular reflection by the specular oxide layer 190.

The magnetic structure 100" shares many of the benefits of the magnetic structures 100 and 100'. Thus, the magnetic structure 100' may have improved thermal stability and performance. Moreover, the magnetic structure 100" may be used in either a CPP or CIP configuration.

Figure 6:
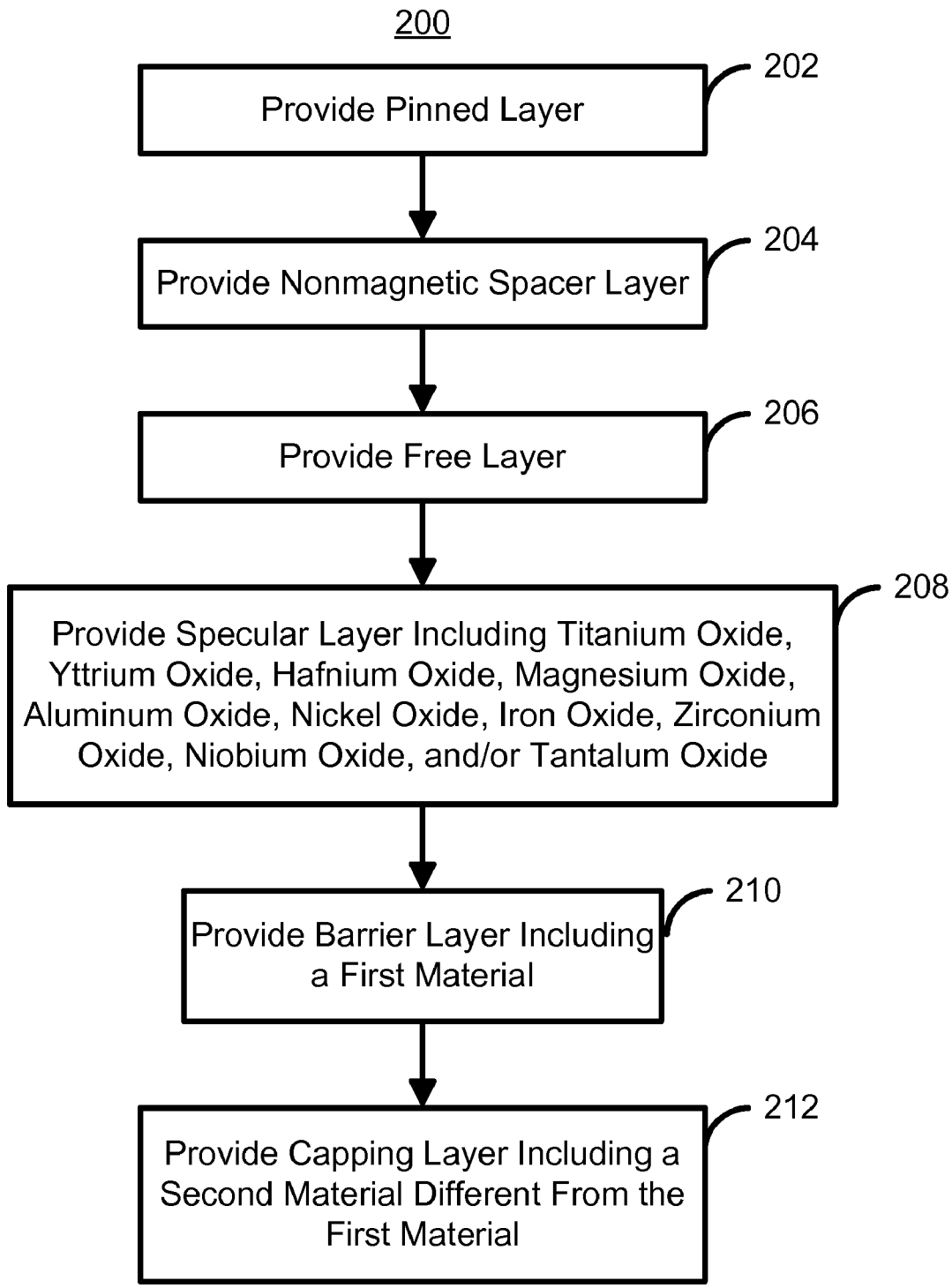
FIG. 6 is a high-level flow chart depicting a method for fabricating a spin filter in accordance with an exemplary embodiment of the present invention.

FIG. 6 is a high-level flow chart depicting a method 200 for fabricating a magnetic structure in accordance with an exemplary embodiment of the present invention. The method 200 is described in the context of the magnetic structure 100'. However, the method 200 may be used for another magnetic structure consistent with the present invention. Moreover, the method 200 is described in the context of forming a single magnetic structure 100'. One of ordinary skill in the art will readily recognize, however, that the method 200 may be used in simultaneously forming multiple magnetic structures and/or other magnetic structure(s) consistent with the present invention.

The method 200 preferably commences after the pinning layer 120' has been provided. The pinned layer 130' is provided, via step 202. Step 202 preferably includes providing the ferromagnetic layers 132 and 136, as well as the spacer layer 134. The nonmagnetic spacer layer 140' is provided, via step 204. Step 204 preferably includes providing an electrically conductive layer, such as Cu. However, in an alternate embodiment, an insulator forming a tunneling barrier is provided in step 204. The free layer 150' is provided such that the nonmagnetic spacer layer 140' resides between the free layer 150' and the pinned layer 130', via step 206. The specular layer 160' is provided on the free layer 150', via step 208. In a preferred embodiment, the specular layer 160 is provided in step 208 by depositing a metallic layer, then oxidizing the metal layer. In a preferred embodiment, a plasma oxidation process preferably from ten to three hundred seconds is used to oxidize the specular metals. However, other oxidation processes such as natural oxidation or radical oxidation may have similar utility. The barrier layer 170' is provided, via step 210. The barrier layer 170' provided in step 210 includes a first material, such as Cu, Pt, Au, or Ag. The capping layer 180 is provided, via step 212. The capping layer 190 includes a second material different from the first material.

Using the method 200, the magnetic structure 100, 100', and/or 100" may be provided.

We claim:

1. A magnetoresistive structure comprising:
a pinned layer;
a spacer layer that is nonmagnetic;
a free layer, the spacer layer residing between the pinned layer and the free layer;
a specular layer adjoining the free layer such that the free layer and specular layer share an interface, the free layer residing between the spacer layer and the specular layer, the specular layer including at least one of titanium oxide, yttrium oxide, hafnium oxide, magnesium oxide, aluminum oxide, nickel oxide, iron oxide, zirconium oxide, niobium oxide, and tantalum oxide;

a barrier layer, the barrier layer being nonmagnetic, the barrier layer including a first material; and a capping layer including a second material different from the first material, the barrier layer residing between the specular oxide layer and the capping layer.

2. The magnetoresistive structure of claim 1 wherein the barrier layer includes at least one of Cu, Pt, Au, and Ag.

3. A magnetoresistive structure comprising:

a pinned layer;

a spacer layer that is nonmagnetic;

a free layer, the spacer layer residing between the pinned layer and the free layer;

a specular layer adjacent to the free layer, the free layer residing between the spacer layer and the specular layer, the specular layer including at least one of titanium oxide, yttrium oxide, hafnium oxide, magnesium oxide, aluminum oxide, nickel oxide, iron oxide, zirconium oxide, niobium oxide, and tantalum oxide;

a barrier layer, the barrier layer being nonmagnetic, the barrier layer including a first material; and a capping layer including a second material different from the first material, the barrier layer residing between the specular oxide layer and the capping layer; and wherein the barrier layer consists essentially of Cu.

4. The magnetoresistive structure of claim 1 wherein the specular layer consists essentially of titanium oxide.

5. The magnetoresistive structure of claim 1 wherein the specular layer has a thickness of at least five and not more than forty Angstroms.

6. The magnetoresistive structure of claim 5 wherein the thickness of the specular layer is at least eight and not more than fifteen Angstroms.

7. The magnetoresistive structure of claim 1 wherein the barrier layer has a thickness of at least five and not more than forty Angstroms.

8. The magnetoresistive structure of claim 7 wherein the thickness of the barrier layer is at least twenty-five and not more than thirty-five Angstroms.

9. The magnetoresistive structure of claim 1 wherein the barrier layer is configured to prevent intermixing between the specular layer and the capping layer.

10. The magnetoresistive structure of claim 1 wherein the pinned layer is a synthetic antiferromagnetic layer including a first ferromagnetic layer, a second ferromagnetic layer and a nonmagnetic, conductive spacer layer between the first and second ferromagnetic layers.

11. The magnetoresistive structure of claim 1 further comprising:

a pinning layer adjacent to the pinned layer, the pinned layer residing between the free layer and the pinning layer.

12. The magnetoresistive structure of claim 11 wherein the pinning layer is an antiferromagnetic layer.

13. The magnetoresistive structure of claim 12 wherein the antiferromagnetic layer includes at least one of IrMn, PtMn, NiMn, and PtCrMn.

14. The magnetoresistive structure of claim 11 further comprising:

a seed layer adjacent to the pinning layer, the pinning layer residing between the pinned layer and the seed layer.

15. The magnetoresistive structure of claim 14 wherein the seed layer further includes at least one of Ta, a bilayer of Ta/NiFe, NiCr, and NiFeCr.

16. The magnetoresistive structure of claim 1 wherein the spacer layer is conductive.

17. The magnetoresistive structure of claim 16 wherein the spacer layer includes at least one of Cu, Ta, Pt, Au, or Ag.

18. A magnetoresistive structure comprising: a pinned layer, the pinned layer being a synthetic antiferromagnetic layer including a first ferromagnetic layer, a second ferromagnetic layer and a nonmagnetic, conductive spacer layer between the first and second ferromagnetic layers;

a second spacer layer that is nonmagnetic and conductive;

a free layer, the second spacer layer residing between the pinned layer and the free layer;

a specular layer adjoining the free layer such that the free layer and specular layer share an interface, the free layer residing between the second spacer layer and the specular layer, the specular layer including at least one of titanium oxide, yttrium oxide, hafnium oxide, magnesium oxide, aluminum oxide, nickel oxide, iron oxide, zirconium oxide, niobium oxide, and tantalum oxide, the specular layer having a specular layer thickness of at least eight and not more than fifteen Angstroms;

a barrier layer, the barrier layer being nonmagnetic, the barrier layer including at least one of Cu, Pt, Au, and Ag, the barrier layer having a barrier thickness of at least twenty-five and not more than thirty-five Angstroms; and a capping layer including a material different from a material of the barrier layer, the barrier layer residing between the specular oxide layer and the capping layer.

* * * * *